(12) United States Patent  (10) Patent No.: US 8,023,038 B2
Chang  (45) Date of Patent: Sep. 20, 2011

(54) CAMERA MODULE

(75) Inventor: Jen-Tsorng Chang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 657 days.

(21) Appl. No.: 12/164,415

(22) Filed: Jun. 30, 2008

(65) Prior Publication Data

US 2009/0109318 A1    Apr. 30, 2009

(30) Foreign Application Priority Data

Oct. 26, 2007    (CN) .......................... 2007 1 0202283

(51) Int. Cl.
*G03B 13/00*    (2006.01)
*G03B 17/00*    (2006.01)
*G03B 17/02*    (2006.01)
*H04N 3/14*    (2006.01)
*H04N 5/225*    (2006.01)
*H04N 5/232*    (2006.01)
*G02B 7/04*    (2006.01)
*H01L 27/00*    (2006.01)
*H01L 27/14*    (2006.01)
*H01L 31/0232*    (2006.01)

(52) U.S. Cl. ........ 348/345; 348/294; 348/335; 348/349; 348/373; 348/374; 250/201.2; 250/208.1; 257/414; 257/431; 257/432; 396/439; 396/535; 396/542

(58) Field of Classification Search ............. 348/207.99, 348/222.1, 294–324, 332, 335–357, 373–376; 396/542, 439, 535; 250/208.1; 257/414–419, 257/431–433

See application file for complete search history.

(56) References Cited

U.S. PATENT DOCUMENTS

| | | | |
|---|---|---|---|
| 6,092,423 A * | 7/2000 | Beardmore | 73/704 |
| 6,473,122 B1 * | 10/2002 | Kanekal | 348/340 |
| 6,967,785 B2 | 11/2005 | Makii et al. | |
| 7,893,992 B2 * | 2/2011 | Vittu | 348/374 |
| 2004/0061799 A1 * | 4/2004 | Atarashi et al. | 348/340 |
| 2004/0201773 A1 * | 10/2004 | Ostergard | 348/374 |
| 2004/0223072 A1 * | 11/2004 | Maeda et al. | 348/340 |
| 2005/0134699 A1 * | 6/2005 | Nagashima et al. | 348/218.1 |
| 2006/0092311 A1 * | 5/2006 | Hartlove et al. | 348/340 |
| 2006/0175532 A1 * | 8/2006 | Boemler | 250/208.1 |
| 2007/0077052 A1 * | 4/2007 | Chang | 396/144 |
| 2008/0273092 A1 * | 11/2008 | Chiou et al. | 348/208.11 |

* cited by examiner

*Primary Examiner* — Jason Chan
*Assistant Examiner* — Michael Osinski
(74) *Attorney, Agent, or Firm* — Altis Law Group, Inc.

(57) ABSTRACT

A camera module includes a lens, an image sensor, a carrier carrying the image sensor, two spring supporting members, a frame, a base and a printed circuit board. The carrier has a comb-shaped first electrode having a number of first teeth. The carrier is suspended in the frame by the two spring supporting members, and is movable in a direction perpendicular to a surface of the image sensor. The base has a comb-shaped second electrode having a number of second teeth. The first teeth and second teeth are arranged in a staggered fashion. The printed circuit board provides a potential difference between the first and second electrodes, whereby an electrostatic force is generated between the first and second teeth to drive the first teeth to move towards the second teeth.

9 Claims, 8 Drawing Sheets

CAMERA MODULE

BACKGROUND

1. Technical Field

The present invention relates to camera modules, and particularly, to a camera module with movable image sensor.

2. Description of Related Art

With the ongoing development of microcircuitry and multimedia technology, camera modules, such as digital camera modules are now in widespread use and are being combined with various electronic devices. These camera modules are often required to have auto focusing function.

Camera modules typically include a number of lenses, and an image sensor aligned with the lenses. Nowadays, driving mechanisms, such as step motors, are often used for driving the lenses to move relative to the image sensor, thereby achieving the auto focusing function. However, the lenses, due to their own configuration for optical need, are bulky, and the step motor itself is also relatively bulky and heavy. In addition, the step motor consumes a substantial amount of power, especially relative to the amount of power that can be stored in a typical battery system of a camera or an electronic device.

What is needed, therefore, is a camera module which has a simple and energy-efficient driving mechanism for image sensor.

SUMMARY

An exemplary camera module includes at least one lens, a barrel receiving the at least one lens therein, an image sensor aligned with the at least one lens, a carrier carrying the image sensor thereon, two spring supporting members, a frame, a base and a printed circuit board. The carrier has a comb-shaped first electrode having a number of first teeth. The two spring supporting members each have a first anchor and a second anchor, the first anchors thereof being attached to opposite sides of the carrier. The frame receives the carrier and the two spring supporting members therein. The second anchors of the two spring supporting members are secured to the frame in a manner such that the carrier is suspended in the frame and is movable in a direction perpendicular to a sensing surface of the image sensor. The base has a through hole therein, and a comb-shaped second electrode having a number of second teeth extending inwardly in the through hole. The base supports the frame. The first teeth are disposed on the second teeth. The first teeth and the second teeth are arranged in a staggered fashion. The printed circuit board is configured for providing a potential difference between the first electrodes and the second electrodes, whereby an electrostatic force is generated between the first teeth and the second teeth to drive the first teeth to move towards the second teeth.

Other advantages and novel features of the present camera module will become more apparent from the following detailed description of preferred embodiment when taken in conjunction with the accompanying drawings.

BRIEF DESCRIPTION OF THE DRAWINGS

Many aspects of the camera module can be better understood with reference to the following drawings. The components in the drawings are not necessarily drawn to scale, the emphasis instead being placed upon clearly illustrating the principles of the present camera module. Moreover, in the drawings, like reference numerals designate corresponding parts throughout the several views.

DETAILED DESCRIPTION OF THE EMBODIMENTS

Embodiments of the present camera module will now be described in detail below and with reference to the drawings.

Figure 1:
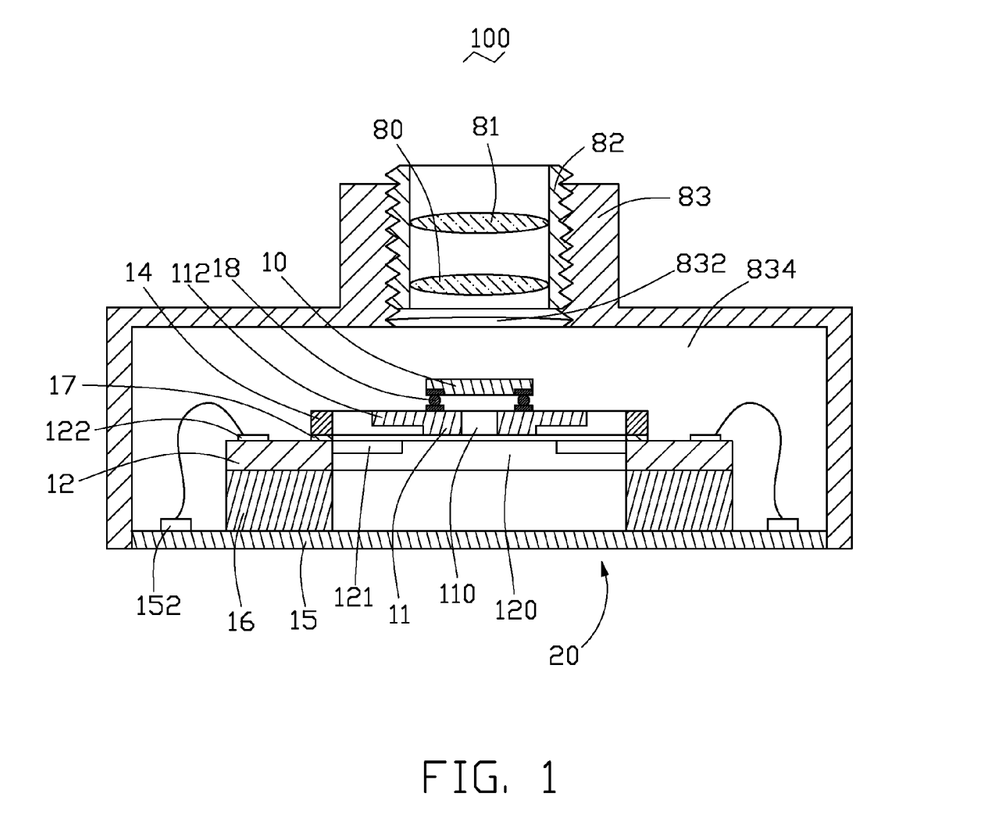
FIG. 1 is a schematic view of a camera module in accordance with a first embodiment of the present invention.
Figure 2:
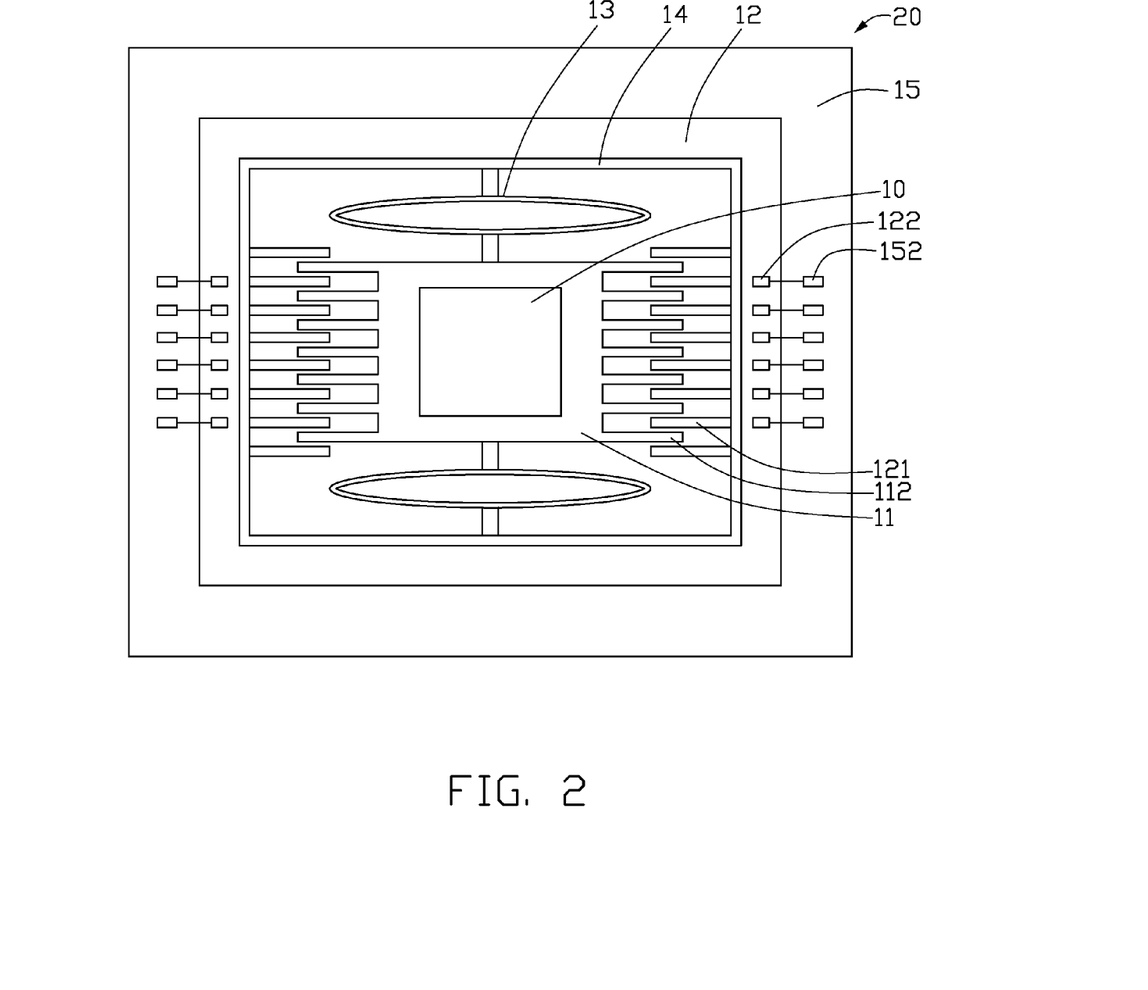
FIG. 2 is a top plan view of the driving mechanism for the image sensor.

Referring to FIGS. 1 and 2, an exemplary camera module 100 in accordance with a first embodiment, is provided. The camera module 100 includes a first lens 80, a second lens 81, a barrel 82 receiving the first and second lenses 80, 81 therein, a holder 83, an image sensor 10, and a driving mechanism 20 configured for driving the image sensor 10.

The first and second lenses 80, 81 can be made of plastic or glass, and can be in a spherical or aspherical shape. The barrel 82 has threads defined in an outer wall thereof. The holder 83 has a cylindrical inner space 832 and a rectangular inner space 834. The holder 83 has threads defined in an inner wall of the cylindrical inner space 832. The barrel 82 is threadingly engaged in the cylindrical inner space 832 of the holder 83.

The image sensor 10 and the driving mechanism 20 are both received in the rectangular inner space 834 of the holder 83. The driving mechanism 20 includes a carrier 11 carrying the image sensor 10, a base 12, two spring supporting members 13, a frame 14, a printed circuit board 15 and an insulating ring-shaped spacer 16. The spacer 16 is arranged on the printed circuit board 15. The base 12 is arranged on the spacer 16.

Figure 3:
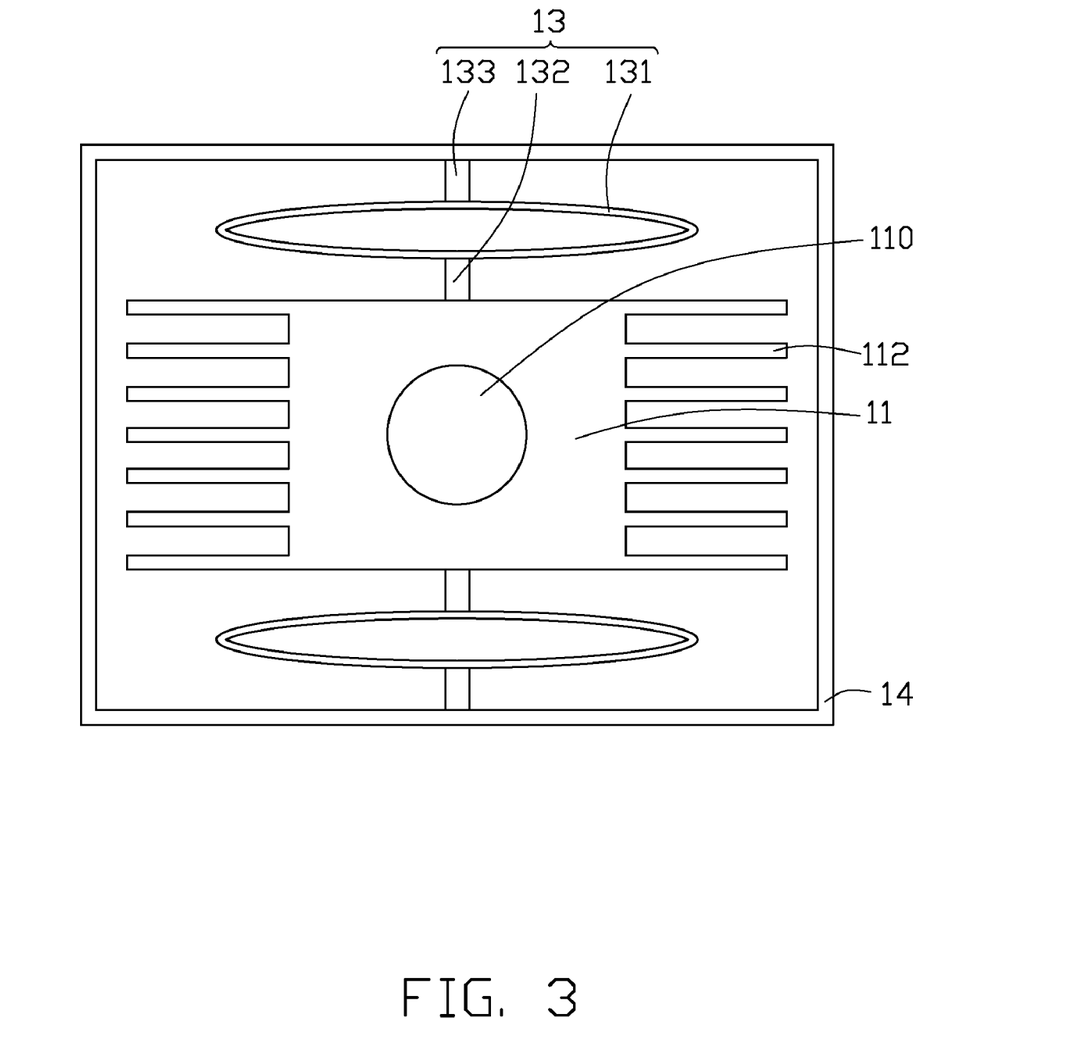
FIG. 3 is a top plan view of the carrier, the two spring supporting members and the frame shown in FIG. 2.

Referring to FIG. 3, the carrier 11 is in a rectangular shape, and has a through hole 110 defined in a central portion thereof. The image sensor 10 is arranged above the through hole 110 of the carrier 11, and is bonded to the carrier 11 by a number of bumps 18. The carrier 11 has a comb-shaped first electrode having a number of first teeth 112. The first teeth 112 are symmetrically arranged on opposite sides of the carrier 11. The first teeth 112 are oriented parallel to and equally spaced apart from each other. The two spring supporting members 13 each have a ring-shaped portion 131, and two elongated anchors 132, 133 each having a first end and an opposite second end. The first ends of the elongated anchors 132, 133 are connected to opposite sides of the ring-shaped portion 131. The second ends of the elongated anchors 132 are attached to opposite sides of the carrier 11. The second ends of the elongated anchors 133 are secured to the frame 14. In this way, the carrier 11 and the two spring supporting members 13 are received in the frame 14. Preferably, the frame 14, the two spring supporting members 13, and the carrier 11 are formed integrally from a single piece using a stamping process. The two spring supporting members 13 provide a desired up and down flexing force, thereby the carrier 11 is suspended in the frame 14 and is movable along a direction perpendicular to a sensing surface of the image sensor 10.

Figure 4:
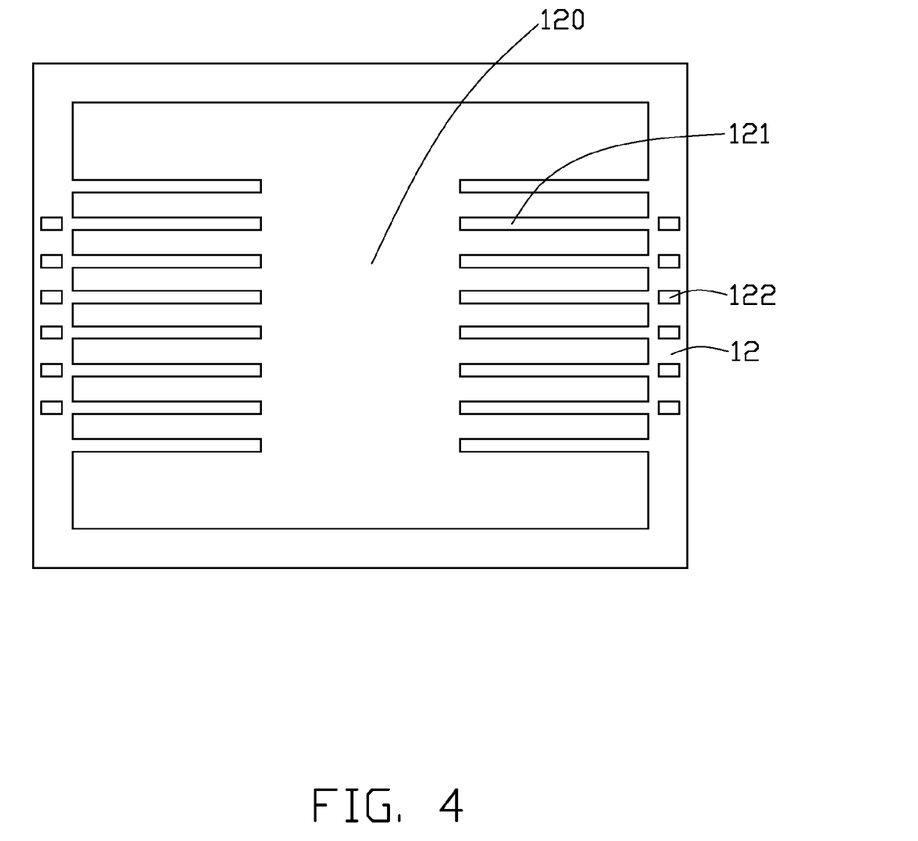
FIG. 4 is a top plan view of the base shown in FIG. 2.

Referring to FIG. 4, the base 12 is also in a rectangular shape, and has a through hole 120 defined in a central portion thereof. A comb-shaped second electrode having a number of second teeth 121 are defined with the second teeth 121 extending inwardly in the through hole 120. The second teeth 121 are oriented parallel to and equally spaced from each other. A number of electrical contact pads 122 are arranged on the base 12.

The frame 14 is arranged on the base 12, with first teeth 112 and the second teeth 121 being arranged in a staggered fashion. A maximum distance between the first teeth 112 and the second teeth 121 can be in a range from 10 micrometers to 10 millimeters. An insulating glue layer 17 can be applied between the frame 14 and the base 12.

The printed circuit board 15 has a number of circuits (not shown) printed thereon. The carrier 11 (or the frame 14) and the base 12 each can be electrically connected to different circuits on the printed circuit board 15, in this way, providing a first voltage for the first electrodes 112, and a second voltage for the second electrodes 121. The printed circuit board 15 further provides a number of electrical contact pads 152. The electrical contact pads 122 on the base 12 can be connected to a respective one of the electrical contact pads 152. The image sensor 10 can be electrically connected to the printed circuit board 15 by the electrical contact pads 122, 152.

Figure 5:
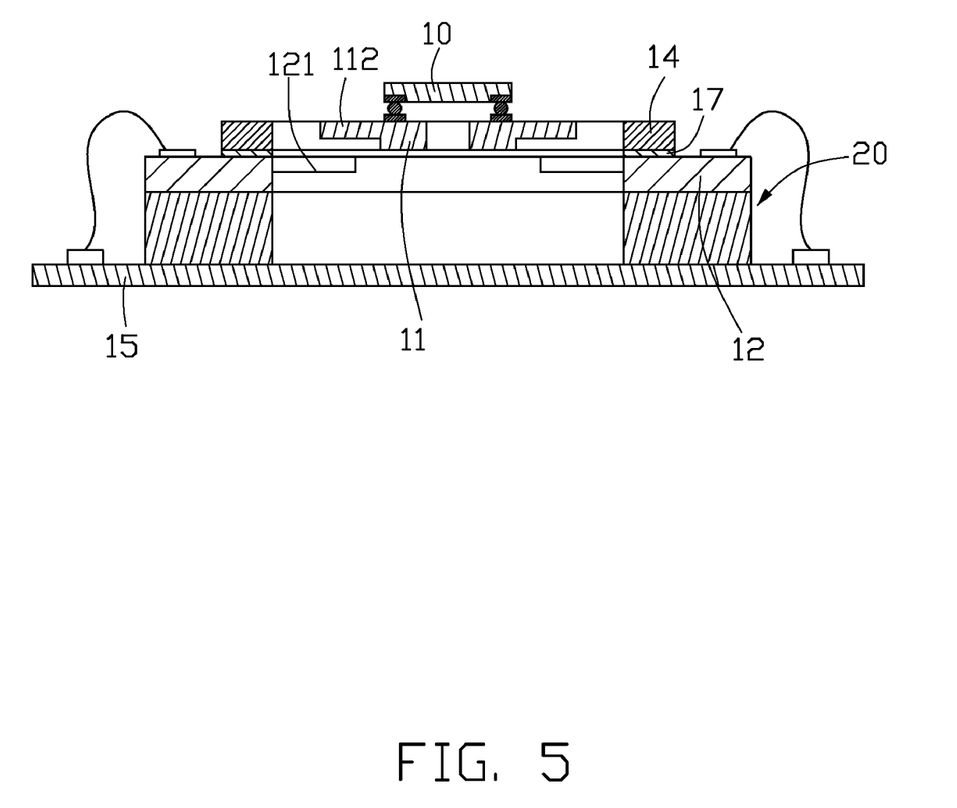
FIG. 5 is a schematic view of the carrier and image sensor at a first position.
Figure 6:
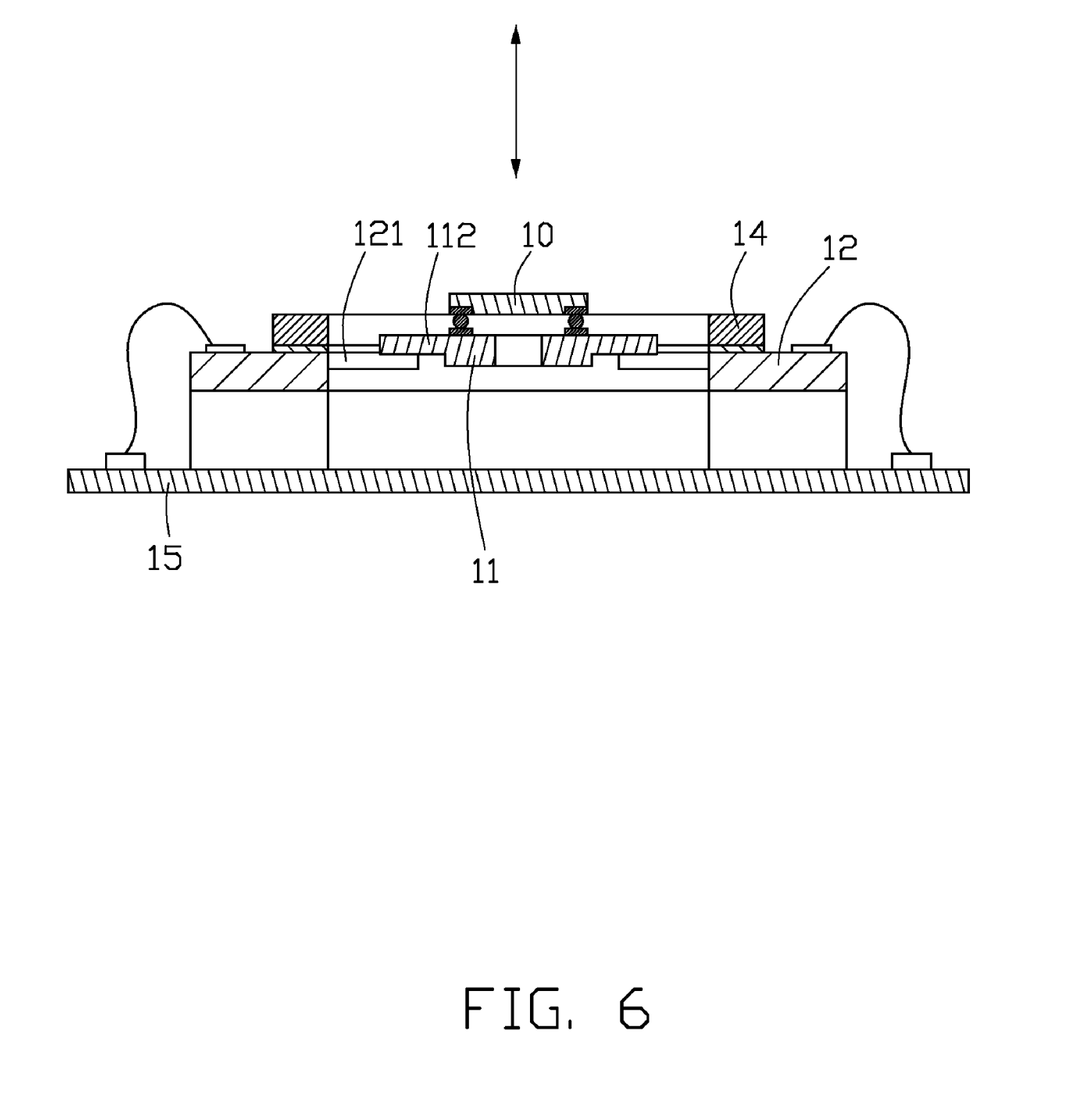
FIG. 6 is a schematic view of the carrier and image sensor at a second position.

At a first position, in FIG. 5, the first teeth 112 each are maintained above the second teeth 121. However, in FIG. 6, when a potential difference exists between the first teeth 112 and the second teeth 121, an electrostatic force will be generated therebetween, and the first teeth 112 will thus be moved down and towards the second teeth 121. In this way, the carrier 11 and the image sensor 10 are brought to a second position. An auto focus function of the camera module 100 can thus be achieved.

Figure 7:
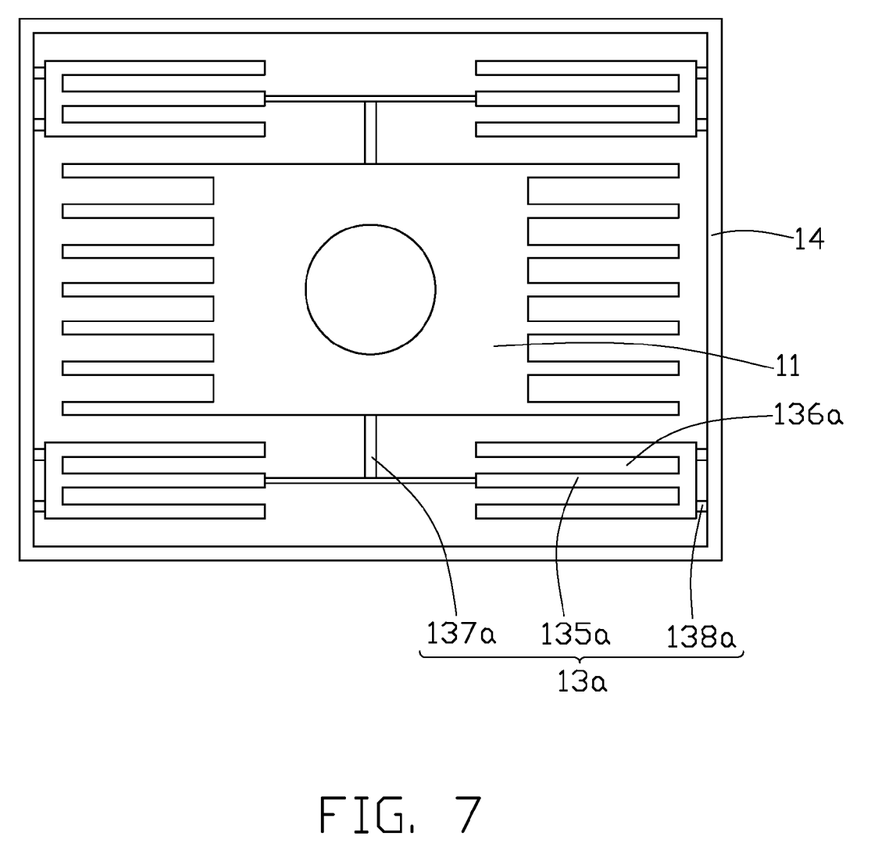
FIG. 7 is similar to FIG. 3, but showing another two spring supporting members in accordance with a second embodiment.

Referring to FIG. 7, another two spring supporting members 13a in accordance with a second embodiment, is provided. The two spring supporting members 13a each are elongated and mainly in a concertinaed configuration with a number of flexible extensions 135a with gaps 136a therebetween, a first anchor 137a, and four second anchors 138a. The gaps 136a allow the flexible extensions 135a to do flexing actions. The flexible extensions 135a cooperate to provide up and down flexing force. for allowing flexing action.

Figure 8:
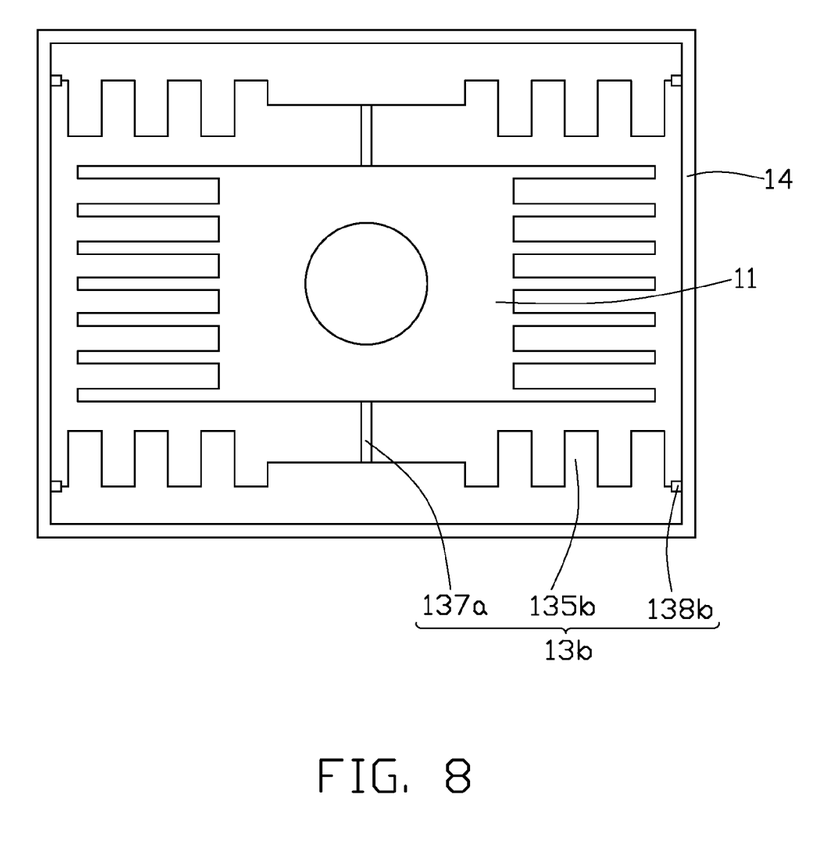
FIG. 8 is similar to FIG. 7, but showing further two spring supporting members in accordance with a third embodiment.

Referring to FIG. 8, further two spring supporting members 13b in accordance with a third embodiment, is provided. The two spring supporting members 13b is similar to the two spring supporting members 13a illustrated above, however, the flexible extensions 135b in the two spring supporting members 13b are overturned, and only two second anchors 138b are needed.

It is understood that the above-described embodiments are intended to illustrate rather than limit the invention. Variations may be made to the embodiments and methods without departing from the spirit of the invention. Accordingly, it is appropriate that the appended claims be construed broadly and in a manner consistent with the scope of the invention.

What is claimed is:

1. A camera module, comprising:
   at least one lens;
   a barrel receiving the at least one lens therein;
   an image sensor aligned with the at least one lens;
   a carrier carrying the image sensor thereon, the carrier having a comb-shaped first electrode having a plurality of first teeth;
   two spring supporting members each having a first anchor and a second anchor, the first anchors thereof being attached to opposite sides of the carrier;
   a frame receiving the carrier and the two spring supporting members therein, the second anchors of the two spring supporting members being secured to the frame in a manner such that the carrier is suspended in the frame and is movable in a direction perpendicular to a sensing surface of the image sensor;
   a base having a through hole therein, and a comb-shaped second electrode having a plurality of second teeth extending inwardly in the through hole, the base supporting the frame, the first teeth being disposed above the second teeth, the first teeth and the second teeth arranged in a staggered fashion; and
   a printed circuit board for providing a potential difference between the first electrode and the second electrode, whereby an electrostatic force is generated between the first teeth and the second teeth to drive the first teeth to move towards the second teeth.

2. The camera module as described in claim 1, further comprising an insulating spacer, the insulating spacer being arranged on the printed circuit board, the base being arranged on the insulating spacer, the frame being secured to base.

3. The camera module as described in claim 2, wherein the carrier has a through hole defined therein, the image sensor being arranged above the through hole.

4. The camera module as described in claim 1, wherein the carrier and the base each are in a rectangular shape, the first teeth being symmetrically arranged on opposite sides of the carrier, the second teeth being symmetrically arranged on opposite sides of the base.

5. The camera module as described in claim 1, wherein a maximum distance between the first teeth and the second teeth is in a range from 10 micrometers to 10 millimeters.

6. The camera module as described in claim 1, wherein the two spring supporting members each have a ring-shaped portion, the first anchor and second anchor being connected to opposite sides of the ring-shaped portion.

7. The camera module as described in claim 1, wherein the two spring supporting members each are elongated and in a concertinaed configuration.

8. The camera module as described in claim 1, wherein the frame, the two spring supporting members, and the carrier are formed integrally from a single piece using a stamping process.

9. The camera module as described in claim 1, further comprising a holder having a cylindrical inner space and a rectangular inner space, the barrel being threadedly engaged in the cylindrical inner space, the image sensor, the frame, the base and the printed circuit board are received in the rectangular inner space.

* * * * *